United States Patent
Cho et al.

(10) Patent No.: US 8,202,761 B2
(45) Date of Patent: Jun. 19, 2012

(54) MANUFACTURING METHOD OF METAL OXIDE NANOSTRUCTURE AND ELECTRONIC ELEMENT HAVING THE SAME

(75) Inventors: Hyung Koun Cho, Suwon Si (KR); Dong Chan Kim, Busan (KR)

(73) Assignee: Sungkyunkwan University Foundation for Corporate Collaboration, Cheoncheon-Dong, Jangan-Gu, Gyeonngi-Do, Suwon-Si (KR)

( * ) Notice: Subject to any disclaimer, the term of this patent is extended or adjusted under 35 U.S.C. 154(b) by 184 days.

(21) Appl. No.: 12/862,895

(22) Filed: Aug. 25, 2010

(65) Prior Publication Data
US 2011/0049467 A1 Mar. 3, 2011

(30) Foreign Application Priority Data
Aug. 25, 2009 (KR) .................. 10-2009-0078460

(51) Int. Cl.
*H01L 21/00* (2006.01)
(52) U.S. Cl. .................. 438/104; 257/E21.001; 438/22; 977/811; 977/890
(58) Field of Classification Search .......... 257/E21.001; 438/22, 104; 977/811, 890
See application file for complete search history.

(56) References Cited

U.S. PATENT DOCUMENTS
2010/0156272 A1\* 6/2010 Kim et al. ................. 313/495
2011/0018427 A1\* 1/2011 Hu et al. ................. 313/495
\* cited by examiner

*Primary Examiner* — Marcos D. Pizarro
(74) *Attorney, Agent, or Firm* — Lexyoume IP Group, PLLC.

(57) ABSTRACT

Disclosed herein is a manufacturing method of metal oxide nanostructure, including the steps of: (S1) supplying a precursor containing a first metal, a precursor containing a second metal and oxygen onto a substrate; (S2) forming an amorphous second metal oxide layer on the substrate; (S3) forming first nuclei containing the first metal as a main component and second nuclei containing the second metal as a main component on the substrate; (S4) converting the first nuclei into single crystalline seed layers spaced apart from each other and converting the second nuclei into amorphous layers surrounding the first nuclei; and (S5) selectively forming rods on the seed layers and then growing the rods.

The manufacturing method of metal oxide nanostructure is advantageous in that the area and thickness of an amorphous layer can be controlled by controlling the flow rate of the main component of the amorphous layer and the flow rate of the main component of the single crystalline seed layer, thereby controlling the density and diameter of the seed layer.

34 Claims, 25 Drawing Sheets

MANUFACTURING METHOD OF METAL OXIDE NANOSTRUCTURE AND ELECTRONIC ELEMENT HAVING THE SAME

BACKGROUND OF THE INVENTION

1. Technical Field

The present invention relates to a manufacturing method of metal oxide nanostructure and an electronic element comprising the same. More particularly, the present invention relates to a manufacturing method of metal oxide nanostructure, in which, in the growth of metal oxide nanostructure, a ternary amorphous layer and a single crystal layer are formed on a native binary amorphous layer by spontaneous phase separation, and thus the diameter and density of metal oxide nanostructure are controlled depending on the relative size of the ternary amorphous layer.

2. Description of the Related Art

Generally, field emission devices include nanostructure having sharp tips, and serve to emit electrons from their tips using the electric field applied to the nanostructure. Field emission devices are practically being used in various electronic apparatuses, for example, field emission displays, X-ray sources, beam lasers, microwave power amplifiers, and various sensors such as biosensors. In these applied products, field emission devices must be embodied such that electrons easily tunnel even at low voltage. That is, it is required that field emission devices be provided with nanostructure which can minimize the diameter of a tip and the work function of the surface of the tip.

In order to realize such nanostructure, research into the structure and material of nanostructure has been made in various ways. As a result, carbon nanotubes (nanowires) or metal oxide semiconductors have attracted considerable attention as materials used in the nanostructure. These materials have been noticed because they have excellent mechanical, thermal and electrical stability.

However, carbon nanotubes are difficult to vertically orient although various growth methods have been proposed. Further, carbon nanotubes have low aspect ratios and poor thermal and mechanical stability compared to metal oxide semiconductors.

Meanwhile, vertical type nanostructure prepared using metal oxide semiconductors can be epitaxially grown using a metal catalyst. Concretely, in the epitaxial growth method, the vertical type nanostructure are grown by patterning a silicon substrate with a metal catalyst such as gold (Au) or the like, which are widely used to fabricate metal oxide nanowires, using photography and then supplying a zinc-containing precursor onto the silicon substrate.

Such epitaxial growth using chemical vapor deposition (CVD) may be performed by a vapor-liquid-solid mechanism (VLS). According to this method, as nanostructure grow, gold (Au) constituting the seed moves to the tips of the nanostructure, and zinc (Zn) moves to the lower ends thereof.

The metal catalyst causes problems such as deterioration in the optical characteristics due to nonluminescent recombination, difficulty in controlling the conductivity of nanowires, deterioration in orientation of nanowires, and the like. In order to solve these problems, various methods have been attempted.

For example, nanowires can be formed by an epitaxial growth method using metalorganic chemical vapor deposition (MOCVD) in which a vapor-solid (VS) mechanism is applied. In this method, the growth of nanowires can be performed without using a metal catalyst. However, during the metalorganic chemical vapor deposition (MOCVD) process, the growth direction of nanowires and the formation of native interface layers are influenced by temperature.

FIGS. 1 to 3 are sectional views showing a conventional process of forming metal oxide nanostructure at low temperature. In FIGS. 1 to 3, the conventional process is performed at a temperature of 400~450° C.

Referring to FIG. 1, a zinc-containing precursor 14 is supplied onto a silicon substrate 10 so that nuclei 12 are formed on the silicon substrate 10 with the nuclei 12 spaced apart from each other. In this case, the nuclei 12 have a size much smaller than that of metal seeds used in chemical vapor deposition (CVD). That is, the size of the nuclei 12 is on the atomic unit scale.

Referring to FIG. 2, in the procedure of supplying the zinc-containing precursor 14 onto the silicon substrate 10 including the nuclei 12, the nuclei 12 formed on the silicon substrate spread and agglomerate with other adjacent nuclei 12 to form grown nuclei 12a having a size smaller than that of metal seeds.

Referring to FIG. 3, when a source gas 15 including a zinc-containing precursor and oxygen gas is supplied thereto with the process temperature maintained at 400~450° C., the grown nuclei 12a are vertically grown by the supply of source gas 15, thus forming high-density nanostructure 18.

According to this method, the nanostructure 18 can be grown in a direction perpendicular to the silicon substrate 10, but native interface layers 16 can be formed between the silicon substrate 10 and the nanostructure 18 in the process of forming the nanostructure 18. Here, each of the native interface layers is disposed at the lower end of each of the nanostructure 18, and such defects as electric potential are concentrated therein. Therefore, at the time that the device is operated, the native interface layers inhibit electrons from moving in the nanostructure 18.

FIGS. 4 to 6 are sectional views showing a conventional process of forming metal oxide nanostructure at high temperature. In FIGS. 4 to 6, the conventional process is performed at a temperature of about 500° C., which is higher than that in the above-mentioned conventional process.

Referring to FIG. 4, a zinc-containing precursor 14 is supplied onto a silicon substrate 10, and thus nuclei 20 are formed on the silicon substrate 10 with nuclei 20 spaced apart from each other. In this case, the nuclei 20 can agglomerate with a larger amount of adjacent nuclei 20 because they can rapidly spread out and move on the silicon substrate 10. Therefore, the size of the nuclei 20 formed at high temperature is larger than that of the nuclei 12 formed at low temperature.

Referring to FIG. 5, in the procedure of supplying the zinc-containing precursor 14 onto the silicon substrate 10 including the nuclei 20, the nuclei 20 more actively grow to form a seed layer 22 having a size similar to that of metal seeds.

Referring to FIG. 6, source gas 23 including a zinc-containing precursor and oxygen gas is supplied onto the seed layer 22, thus forming nanostructure 24. In this high-temperature process, native interface layers are not formed unlike by the above low-temperature process, whereas the seed layer 22 may have various crystal orientations depending on the growth orientation of the nuclei 20 constituting the seed layer 22. Therefore, since the seed layer 22 does not grow in a direction perpendicular to the silicon substrate 10, the seed layer 22 grows into radial nanostructure 24 having various growth orientations.

Meanwhile, it is typically required that the above field emission devices used in electronic apparatuses directionally emit electrons. For this reason, the fact that the nanostructure 24 do not vertically grow does not comply with this requirement. Further, since the nanostructure 24 are not vertically aligned, it is difficult to conduct subsequent processes.

Thus, the present inventors have researched metal oxide nanostructure which can be vertically aligned and improve field emission characteristics. Concretely, they have researched forming metal oxide nanostructure using a single-crystalline seed layer including a first metal as a main component and an amorphous layer including a second metal as a main component formed on a substrate.

In particular, amorphous layers may occupy larger areas than do seed layers depending on such process conditions as relative flow rates of reactants, pressure and temperature in a chamber and the like in the procedure of supplying reaction gas. Owing to this fact, it was found that it is possible to control the density and diameter of seed layers. Since metal oxide nanostructure are formed by vertically growing the seed layers, the density and diameter of the metal oxide nanostructure can be controlled by controlling the relative areas of the amorphous layers to the seed layers.

SUMMARY OF THE INVENTION

Accordingly, the present invention has been devised to solve the above-mentioned problems, and objects of the present invention are as follows.

First, the present invention intends to control the density and diameter of seed layers, on which metal oxide nanostructure will be formed, by controlling the area of amorphous layers formed on a substrate.

Second, the present invention intends to vertically align metal oxide nanostructure on a substrate.

Third, the present invention intends to provide an electronic element including the metal oxide nanostructure.

Objects of the present invention are not limited to the above-mentioned objects, and will be apparent from the following description of embodiments with reference to the accompanying drawings.

An aspect of the present invention provides a method of manufacturing method of metal oxide nanostructure, comprising the steps of: (S1) supplying a precursor containing a first metal, a precursor containing a second metal and oxygen onto a substrate; (S2) forming an amorphous second metal oxide layer on the substrate; (S3) forming first nuclei containing the first metal as a main component and second nuclei containing the second metal as a main component on the substrate; (S4) converting the first nuclei into single crystalline seed layers spaced apart from each other and converting the second nuclei into amorphous layers surrounding the first nuclei; and (S5) selectively forming rods on the seed layers and then growing the rods, wherein the first meal, the second metal and the oxygen are supplied throughout steps 1 to 5 (S1 to S5).

Here, the second metal may form an amorphous phase at a temperature at which the first metal forms a single-crystal phase.

Further, the first metal may be zinc (Zn), and the second metal may be magnesium (Mg).

Further, the flow ratio of zinc (Zn) and oxygen supplied onto the substrate may be 1:180~1:200.

Further, the flow ratio of zinc (Zn) and magnesium (Mg) supplied onto the substrate 100 may be 1:¼~1:⅛.

Further, in step 1 (S1), the precursor containing the first metal, the precursor containing the second metal, and the oxygen may be simultaneously supplied, but the precursor containing the first metal may be supplied earlier than the precursor containing the second metal.

Further, in step 4 (S4), the seed layers may be formed into a ternary oxide alloy film ($Zn_xMg_{1-x}O$ (0<x<1)) containing zinc as a main component.

Further, in step 4 (S4), the amorphous layers may be formed into a ternary oxide alloy film ($Zn_xMg_{1-x}O$ (0<x<1)) containing magnesium as a main component.

Further, the rods may be made of a ternary oxide alloy film ($Zn_xMg_{1-x}O$ (0<x<1)) containing zinc as a main component.

Further, the rods may be formed in a [0001] orientation which is perpendicular to the substrate.

Another aspect of the present invention provides an electronic element, comprising: a first substrate including a cathode; a second substrate spaced apart from the first substrate and including an anode; and the metal oxide nanostructure formed on the cathode and formed by the method.

Here, the anode may face the cathode, and may include fluorescent layers thereon.

Further, the cathode may be disposed on the first substrate in a pattern of a plurality of stripes along a first direction.

Further, the cathode may further include a plurality of gate electrodes 208 growing and crossing along a second direction different from the first direction thereon.

Further, the electrode element may be applied to any one selected from the group consisting of a field emission display (FED), a plasma display panel (PDP), a microwave amplifier, a beam laser used in the manufacturing semiconductors, and a biosensor.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
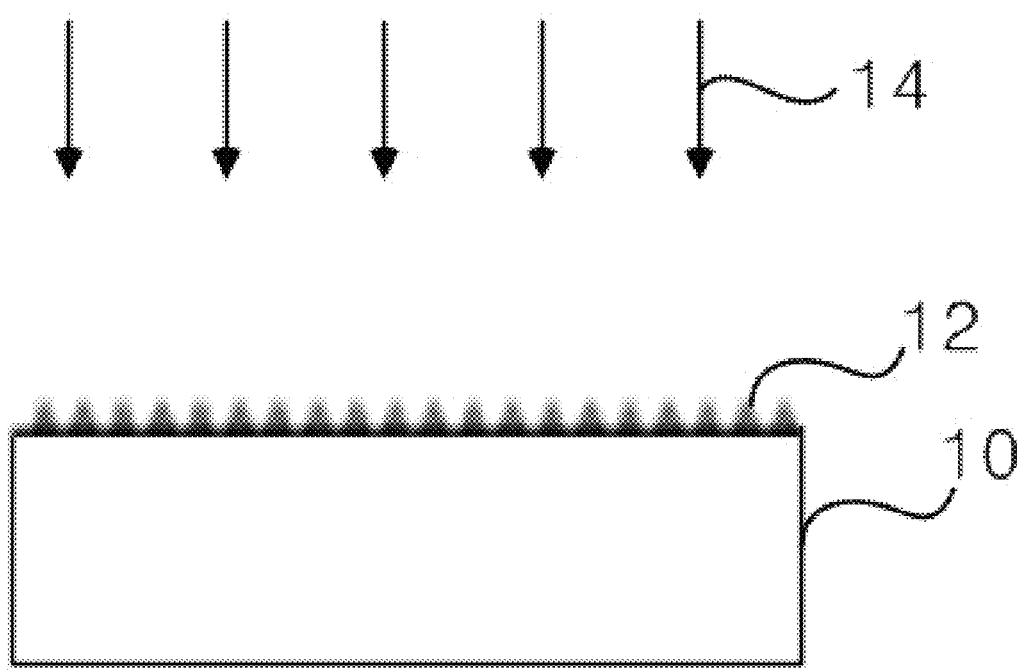
FIGS. 1 to 3 are sectional views showing a conventional process of forming metal oxide nanostructure at low temperature.
Figure 2:
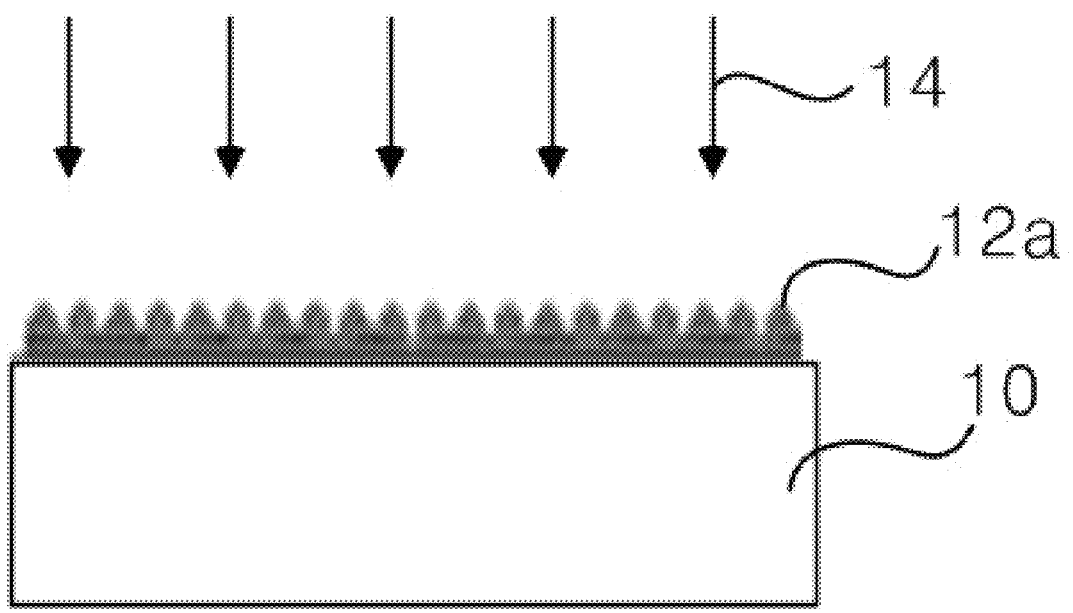
Figure 3:
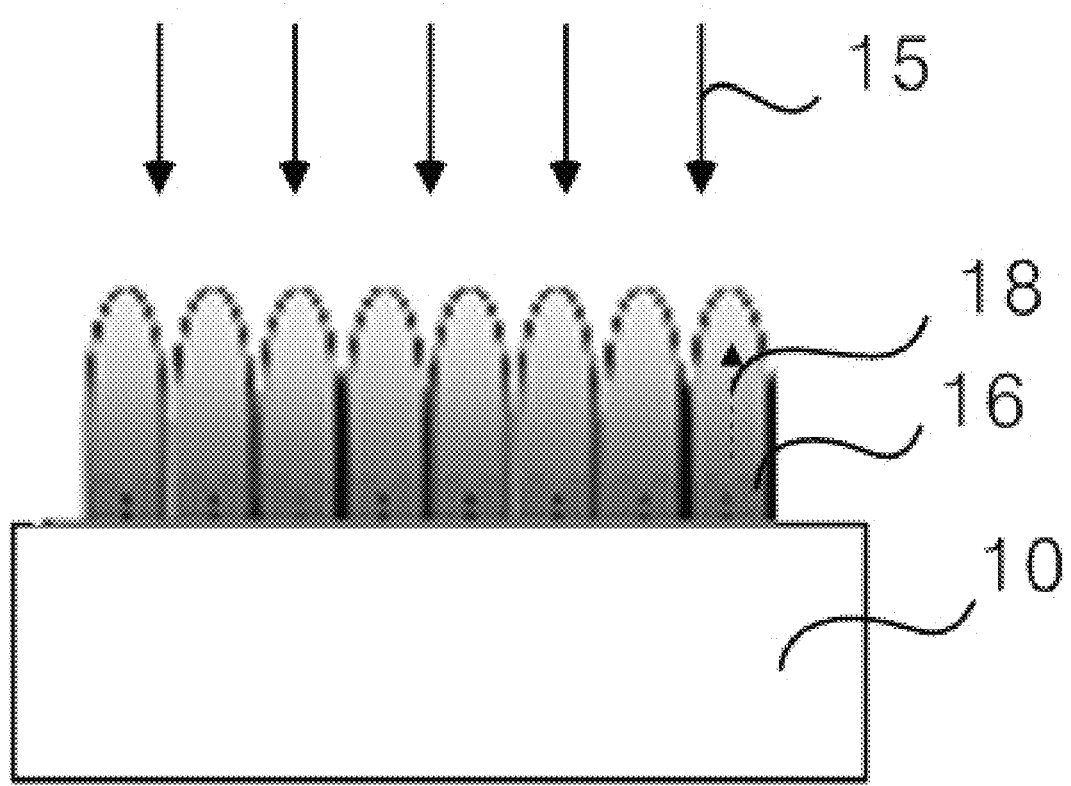
Figure 4:
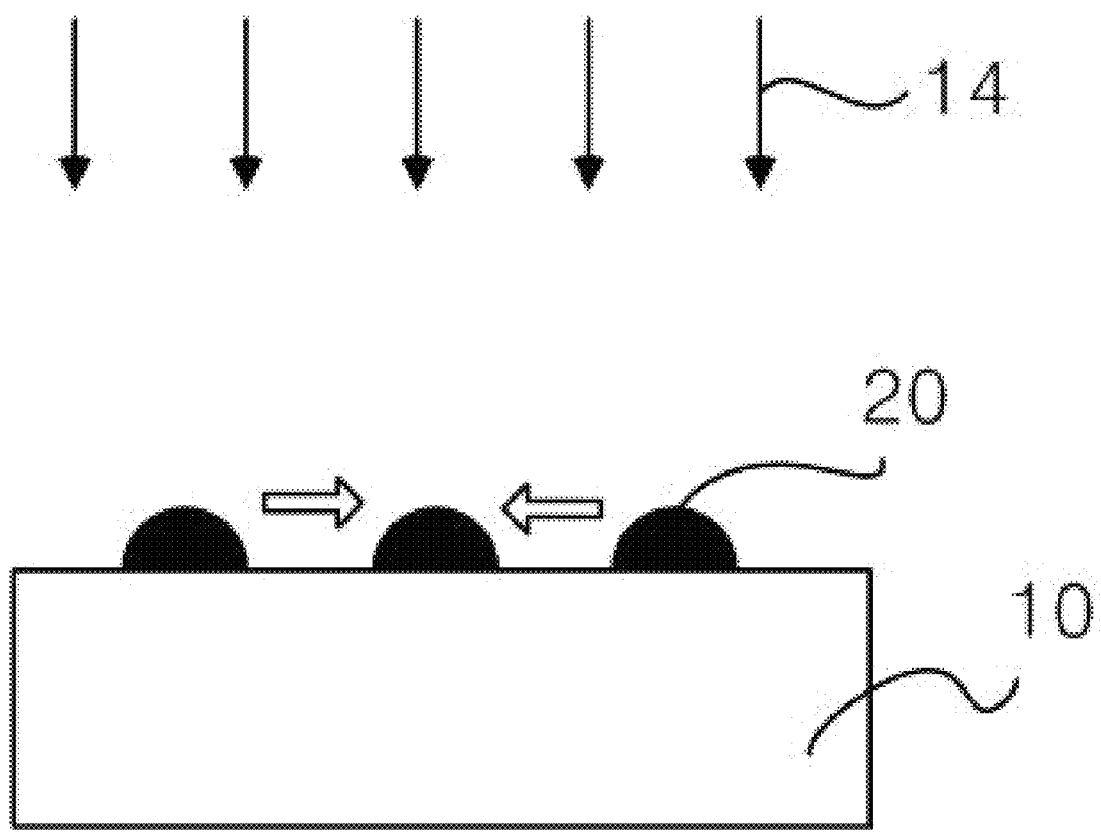
FIGS. 4 to 6 are sectional views showing a conventional process of forming metal oxide nanostructure at high temperature.
Figure 5:
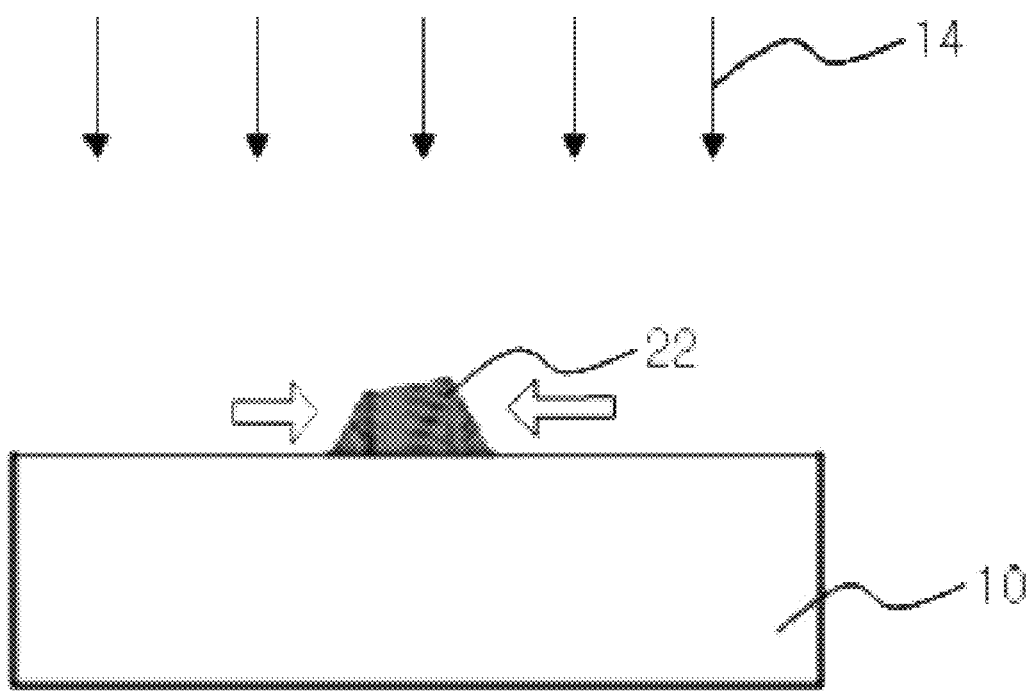
Figure 6:
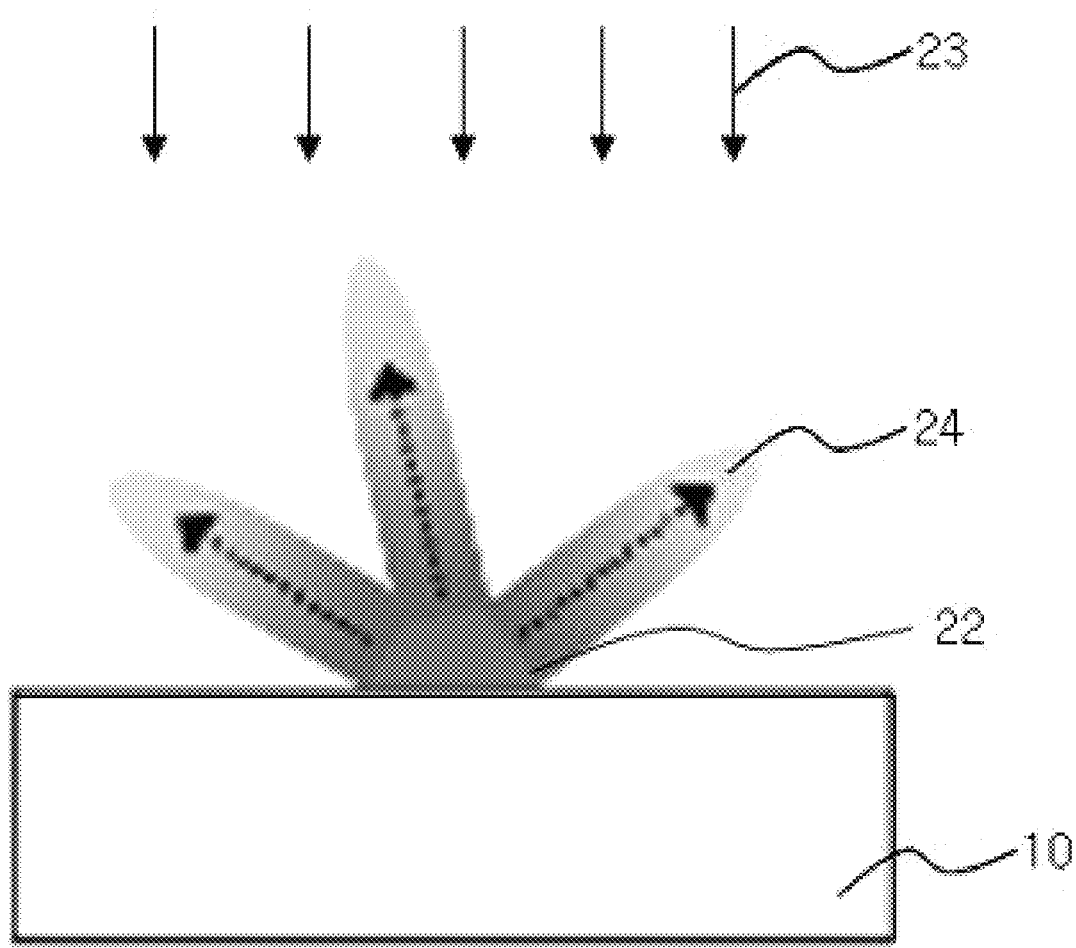
Figure 7:
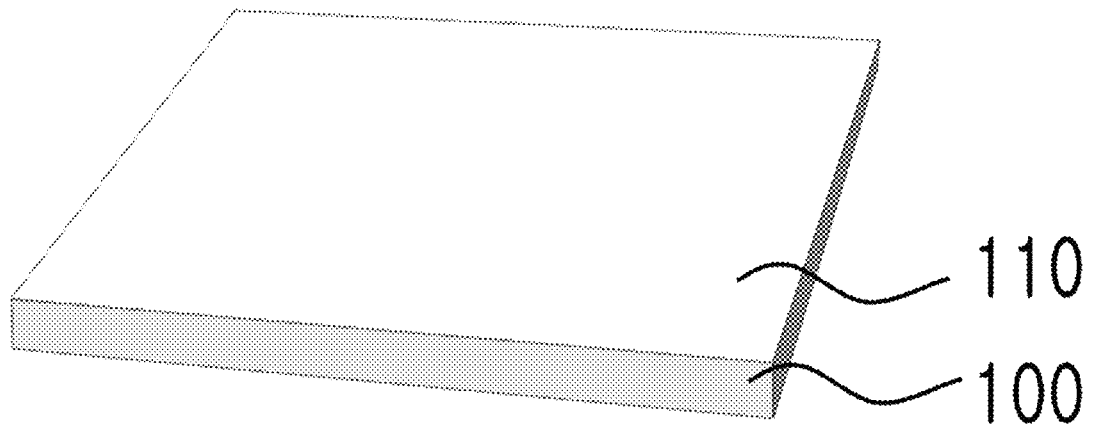
FIGS. 7 to 11 are schematic perspective views showing a manufacturing method of metal oxide nanostructure according to the present invention.
Figure 8:
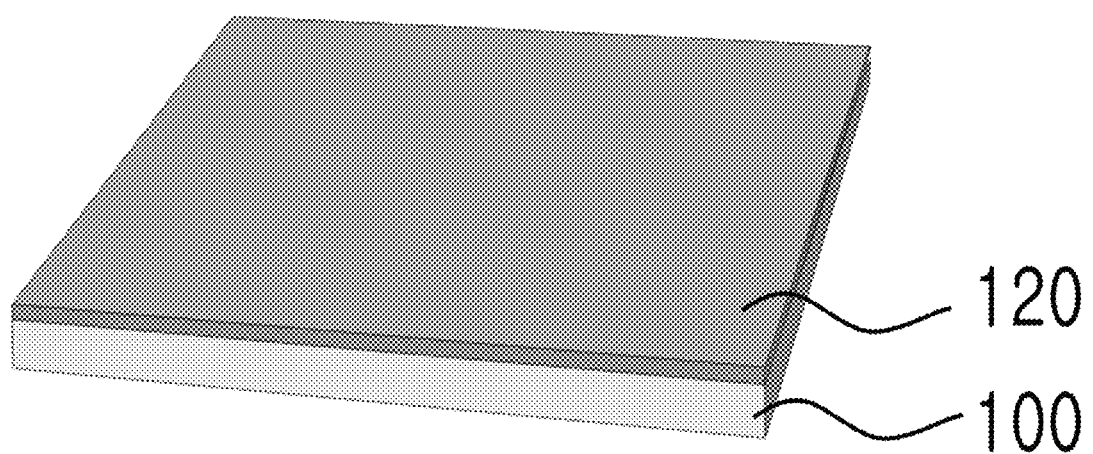

Hereinafter, preferred embodiments of the present invention will be described in detail with reference to the attached drawings. The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

The thickness of layers and regions shown in drawings will be partially exaggerated in order to clearly describe the contents of the present invention. Reference now should be made to the drawings, in which the same reference numerals are used throughout the different drawings to designate the same or similar components.

Further, the description that an element or a layer is disposed "on" another element or another layer includes the idea that another element or another layer is disposed between an element or a layer and the other element or the other layer as well as an element or a layer is disposed right above another element or another layer.

FIGS. 7 to 11 are schematic perspective views showing a manufacturing method of metal oxide nanostructure according to an embodiment of the present invention. Hereinafter, the manufacturing method of metal oxide nanostructure will be described in detail with reference to FIGS. 7 to 11.

The manufacturing method of metal oxide nanostructure according to the present invention includes the steps of: (S1) supplying a precursor containing a first metal, a precursor containing a second metal and oxygen onto a substrate; (S2) forming an amorphous second metal oxide layer on the substrate; (S3) forming first nuclei containing the first metal as a main component and second nuclei containing the second metal as a main component on the substrate; (S4) converting the first nuclei into single crystalline seed layers spaced apart from each other and converting the second nuclei into amorphous layers surrounding the first nuclei; and (S5) selectively forming rods on the seed layers and then growing the rods.

Here, the substrate 100 may be made of any one selected from the group consisting of silicon, sapphire, gallium nitride, glass, and indium tin oxide (ITO). In this embodiment, a silicon substrate is used as the substrate 100. The substrate 100 is washed with ultrasonic waves or the like. After the ultrasonic washing of the substrate 100, the substrate may be chemically washed with acetone or methanol, and then washed with purified water. Thereafter, the substrate 100 may be dried in an oven at a predetermined temperature.

Subsequently, the washed substrate 100 is loaded in a chamber (not shown) that is being maintained at a predetermined temperature. In this case, generally, a native $SiO_2$ layer 110 is formed on the substrate 100 (refer to FIG. 7).

Thereafter, a precursor containing a first metal, a precursor containing a second metal, and oxygen are supplied onto a substrate by an injector such as a shower head (not shown) that has been placed in the chamber (S1).

In the present invention, the first metal may be a metal forming a single-crystal phase at a predetermined temperature, and the second metal may be a metal forming an amorphous phase at the temperature. According to an embodiment of the present invention, zinc (Zn) is used as the first metal, and magnesium (Mg) is used as the second metal. Hereinafter, the present invention will be described based this embodiment.

According to the manufacturing method of metal oxide nanostructure of the present invention, the first metal, the second metal and the oxygen gas are supplied onto the substrate 100 throughout steps 1 to 5 (S1 to S5). The flow ratio of zinc (Zn) and oxygen supplied onto the substrate may be 1:180~1:200.

When the flow rate of oxygen is more than 200 times the flow rate of zinc (Zn), there is a problem in that nanowires become thick, and thus they change into the form of a clustered particle. Further, when the flow rate of oxygen is less than 180 times the flow rate of zinc (Zn), there is a problem in that microstructures are formed instead of nanostructure According to the manufacturing method of metal oxide nanostructure of the present invention, the flow ratio of zinc (Zn) and magnesium (Mg) supplied onto the substrate 100 may be 1:¼~1:⅛.

When the flow rate of magnesium (Mg) is above ¼ times the flow rate of zinc (Zn), there is a problem in that amorphous layers containing magnesium (Mg) as a main component are excessively formed, and thus single crystalline seed layers containing zinc (Zn) as a main component are not sufficiently formed. Further, when the flow rate of magnesium (Mg) is below ⅛ times the flow rate of zinc (Zn), there is a problem in that microstructures are formed instead of nanostructure.

In step 1 (S1), the precursor containing the first metal, the precursor containing the second metal, and the oxygen may be simultaneously supplied onto the substrate 100. Further, in step 1 (S1), the precursor containing the first metal may be supplied earlier than the precursor containing the second metal.

In step 1 (S2), an amorphous second metal oxide film 120 is formed on the substrate 100. When the second metal is magnesium (Mg), an amorphous magnesium oxide (MgO) film 120 is formed on the substrate 100. The reason for this is that magnesium (second metal) is formed into an oxide film earlier than zinc (first metal) because the oxidation reaction of magnesium (second metal) stably occurs compared to that of zinc (first metal) in terms of energy (refer to FIG. 8). In contrast, zinc cannot be easily attached to the substrate 100 compared to magnesium.

Therefore, in step 1 (S1), in order to form the seed layers containing zinc as a main component, it is preferred that zinc be supplied earlier than magnesium.

In the manufacturing method of metal oxide nanostructure according to the present invention, the precursor containing zinc (Zn) may be any one selected from the group consisting of dimethyl zinc $[Zn(CH_3)_2]$, diethyl zinc $[Zn(C_2H_5)_2]$, zinc acetate $[Zn(OOCCH_3)_2.H_2O]$, zinc acetate anhydride $[Zn(OOCCH_3)_2]$, and zinc acetylacetonate $[Zn(C_5H_7O_2)_2]$.

In the manufacturing method of metal oxide nanostructure according to the present invention, the precursor containing magnesium (Mg) may be any one selected from the group consisting of bis-cyclopentadienyl magnesium ($Cp_2Mg$), iodomethyl magnesium (MeMgI), and dimethyl magnesium ($Et_2Mg$).

In the manufacturing method of metal oxide nanostructure according to the present invention, the precursor containing the first metal and the precursor containing the second metal are generally supplied by carrier gas including inert gas.

In the manufacturing method of metal oxide nanostructure according to the present invention, the oxygen is supplied by oxygen-containing gas. The oxygen-containing gas may be any one selected from the group consisting of oxygen, ozone, nitrogen dioxide, water vapor, and carbon dioxide.

It is preferred that the carrier gas and the oxygen-containing gas be supplied at a temperature of 400~600° C., which is the temperature in the chamber. The reason for this is that at this temperature range, zinc can be formed into a single crystal phase, and magnesium can be formed into an amorphous phase.

Further, It is preferred that the carrier gas and the oxygen-containing gas be supplied for 20~40 seconds. Further, the carrier gas and the oxygen-containing gas may be supplied at a temperature of below 1 torr, preferably, below 0.001 torr. The zinc-containing precursor may be supplied into the chamber at a flow rate of 5~10 μmol/min. The magnesium-containing precursor may be supplied into the chamber at a flow rate of 1~5 μmol/min. Further, the oxygen-containing gas may be supplied into the chamber at a flow rate of 50~100 sccm. The inert gas, that is, the carrier gas may be supplied into the chamber at a flow rate of 10~100 sccm. These precursors and oxygen-containing gas may be supplied in the manner commonly known to those skilled in the art.

In step 3 (S3) first nuclei containing the first metal as a main component and second nuclei containing the second metal as a main component are formed on the substrate 100. The forming of the first nuclei and the second nuclei may be performed at a temperature of 400~600° C. and a pressure of below 1 torr for 20~40 seconds.

Moreover, the first nuclei may be formed so that they have a predetermined orientation. For example, they may have a [0001] orientation. The [0001] orientation means an orientation which is perpendicular to the main surface of the substrate 100.

In step 4 (S4), the first nuclei are converted into single crystalline seed layers 130 spaced apart from each other, and the second nuclei are converted into amorphous layers 140 surrounding the first nuclei.

The temperature of 400~600° C. in the chamber is a temperature at which zinc is formed into a single crystal phase and magnesium is formed into an amorphous phase. Therefore, zinc nuclei are grown into the single crystalline seed layers 130, and magnesium nuclei are grown into the amorphous layers 140. In this case, the seed layers 130 and the amorphous layers may have a molecular unit thickness of several nanometers (nm). For the sake of explanation, in drawings, the seed layers 130 and the amorphous layers are exaggerated.

Magnesium is formed into an amorphous phase at the temperature of 400~600° C. at which zinc is formed into a single crystal phase. When the flow rate of magnesium is ¼~⅛ times the flow rate of zinc at such a temperature, magnesium enables the amorphous layers 140 formed by the second nuclei to grow more.

Figure 9:
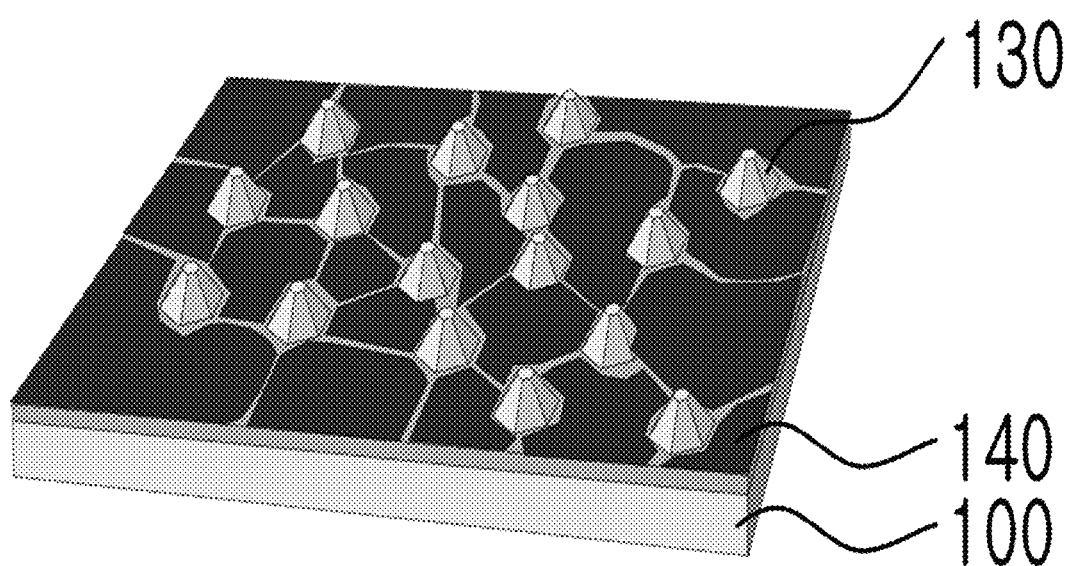

The first nuclei, that is, zinc nuclei containing zinc as a main component are formed into single crystalline seed layers 130 on the substrate 100, and the seed layers 130 may be spaced apart from each other (refer to FIG. 9).

Since magnesium nuclei are formed in a molecular unit size and have higher adsorption energy than zinc, they occupy a larger area than zinc nuclei in the initial nuclei growth procedure. In this embodiment, as examples of the nuclei containing the first metal and the nuclei containing the second metal, zinc nuclei and magnesium nuclei are exemplified, but those skilled in the art can arbitrarily select metals meeting the above conditions without departing from the scope of the present invention.

The second nuclei, that is, magnesium nuclei containing magnesium as a main component are formed into amorphous layers 140 on the substrate 100, and the amorphous layers 140 surround zinc nuclei. Therefore, the amorphous layers 140 disposed between zinc nuclei, that is, the amorphous layers 140 surrounding zinc nuclei are amorphous regions on the substrate 100 (refer to FIG. 9). Meanwhile, zinc nuclei may also be formed in a molecular unit size.

The seed layers 130 are formed into a single crystalline ternary MgZnO alloy film (s-MgZnO), and the amorphous layers 140 are formed into an amorphous ternary MgZnO alloy film (a-MgZnO).

If the main component is defined as a metal relatively mostly included in the seed layers 130 or the amorphous layers 140 among metal components excluding oxygen, the seed layers 130 include a relatively larger amount of zinc than they do magnesium, and the amorphous layers 140 include a relatively larger amount of magnesium than they do zinc. Therefore, the seed layers 130 may be formed such that they have the same orientation as that of zinc nuclei. For example, they may have a [0001] orientation. The [0001] orientation means an orientation which is perpendicular to the main surface of the substrate 100.

Figure 10:
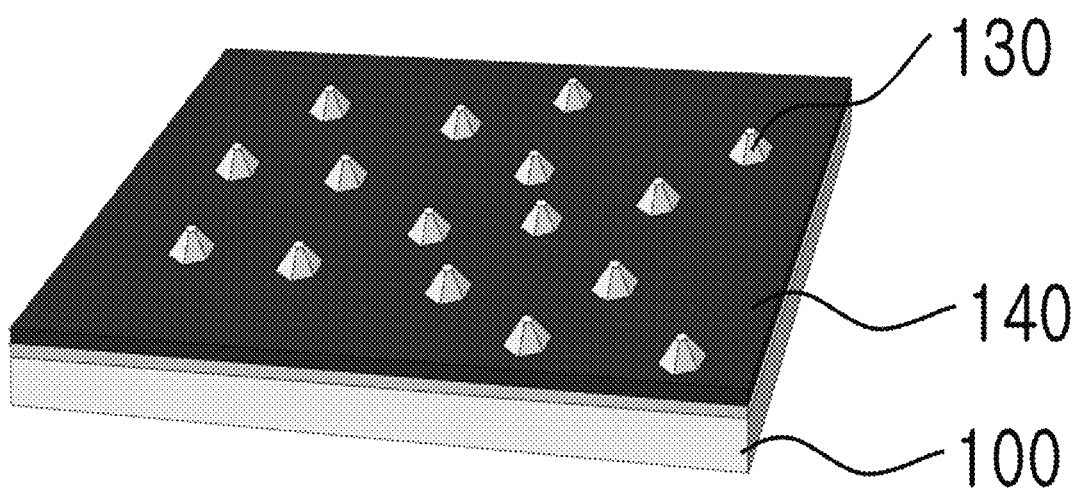
Figure 13:
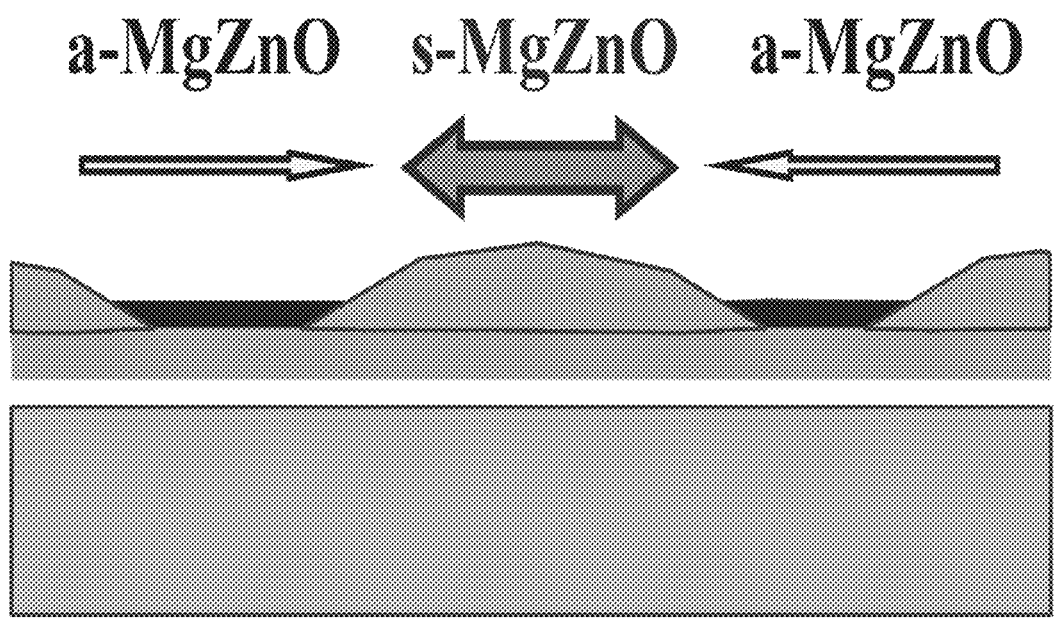
FIGS. 13 and 14 are schematic sectional views showing the case that single crystalline seed layers (s-MgZnO) having a large diameter are formed because amorphous layers (a-MgZnO) containing a second metal as a main component are relatively thin compared to the single crystalline seed layers and are formed over a small area of a substrate.
Figure 14:
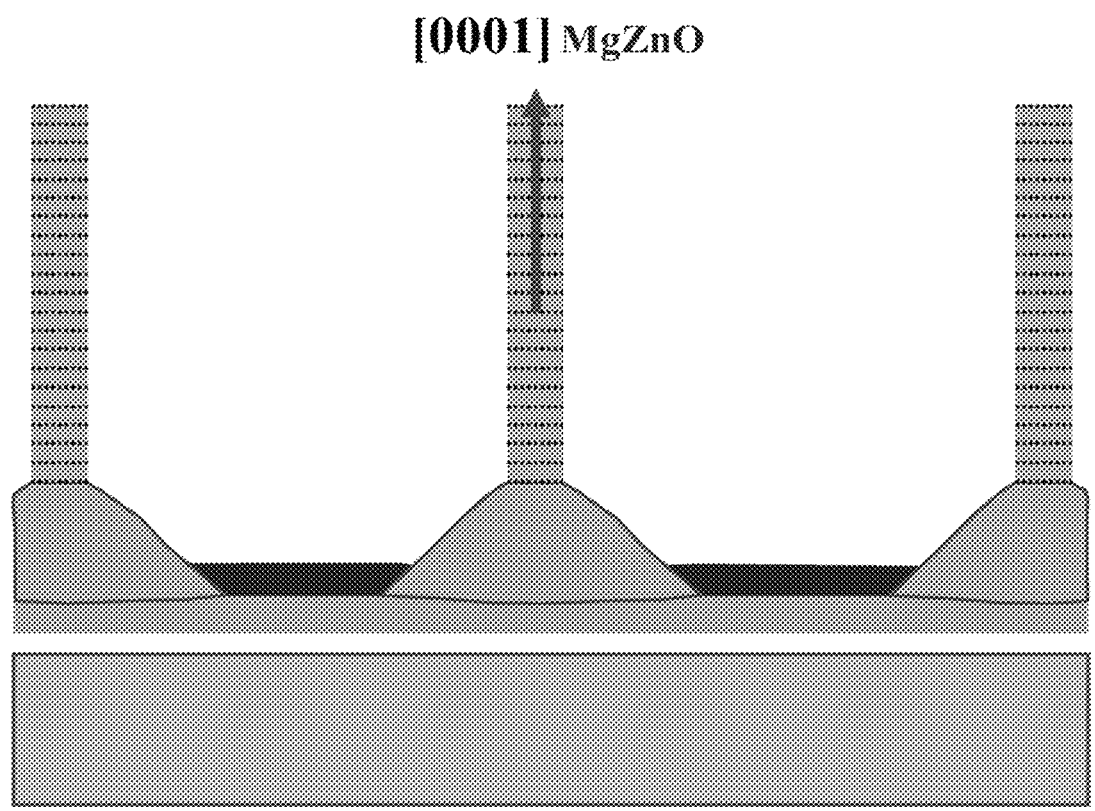
Figure 15:
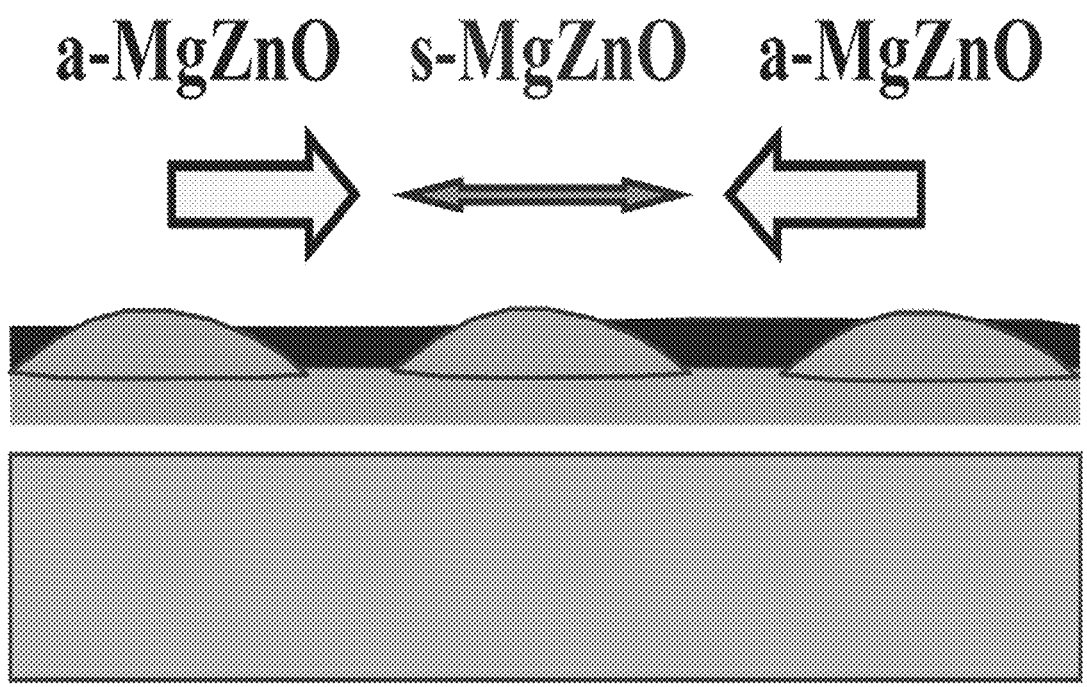
FIGS. 15 and 16 are schematic sectional views showing the case that single crystalline seed layers (s-MgZnO) having a small diameter are formed because amorphous layers (a-MgZnO) containing a second metal as a main component are relatively thick compared to the single crystalline seed layers and are formed over a large area of a substrate.
Figure 16:
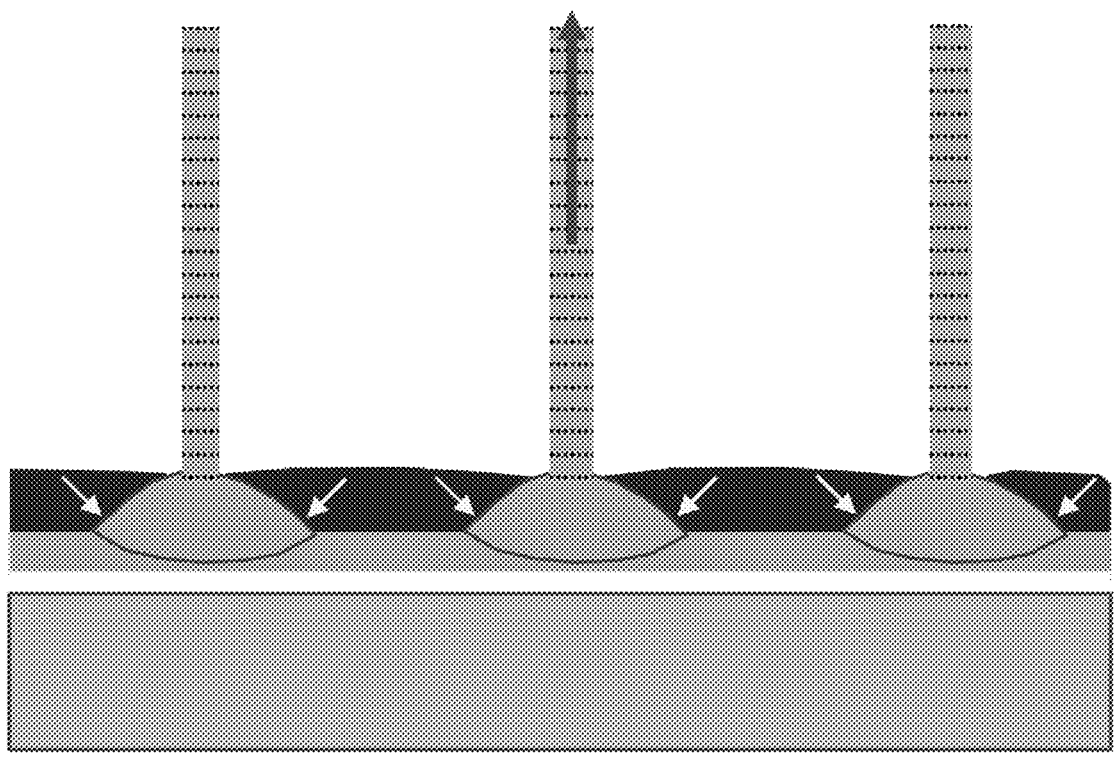

Comparing FIG. 9 with FIG. 10, it can be seen that the density and diameter of the seed layers (s-MgZnO) 130, which are single crystal regions formed by the first nuclei, are decreased when the amorphous layers (a-MgZnO) 140 are grown on the substrate 100. Here, the meaning of "the density of the seed layers (s-MgZnO) 130 decreases" is that the number of seed layers (s-MgZnO) 130 formed on the substrate 100 decreases. Further, the meaning of "the diameter of the seed layers (s-MgZnO) 130 decreases" is that the region occupied by the amorphous layers (a-MgZnO) 140 on the substrate increases, and thus the region occupied by the seed layers (s-MgZnO) 130 on the substrate decreases (refer to FIG. 13).

In other words, the amorphous layers (a-MgZnO) 140 can occupy larger areas than the seed layers (s-MgZnO) 130 depending on such process conditions as flow rates of reactants, pressure and temperature in a chamber and the like in the procedure of supplying the reaction gas. That is, since magnesium has a higher adsorption energy than zinc, the amorphous layers (a-MgZnO) 140 can occupy larger areas than the seed layers (s-MgZnO) 130. Therefore, it is possible to prevent the width of the seed layers (s-MgZnO) 130 from increasing.

In step 4 (S4), the seed layers (s-MgZnO) 130 may be formed into a ternary oxide alloy film ($Zn_xMg_{1-x}O$ ($0<x<1$)) containing zinc as a main component. More preferably, the seed layers (s-MgZnO) 130 may be formed into a ternary oxide alloy film ($Zn_xMg_{1-x}O$ ($0.6 \leq x \leq 0.8$)).

In step 4 (S4), the amorphous layers (a-MgZnO) 140 may be formed into a ternary oxide alloy film ($Zn_xMg_{1-x}O$ ($0<x<1$)) containing magnesium as a main component. More preferably, the amorphous layers (a-MgZnO) 140 may be formed into a ternary oxide alloy film ($Zn_xMg_{1-x}O$ ($0.3 \leq x \leq 0.5$)).

Figure 11:
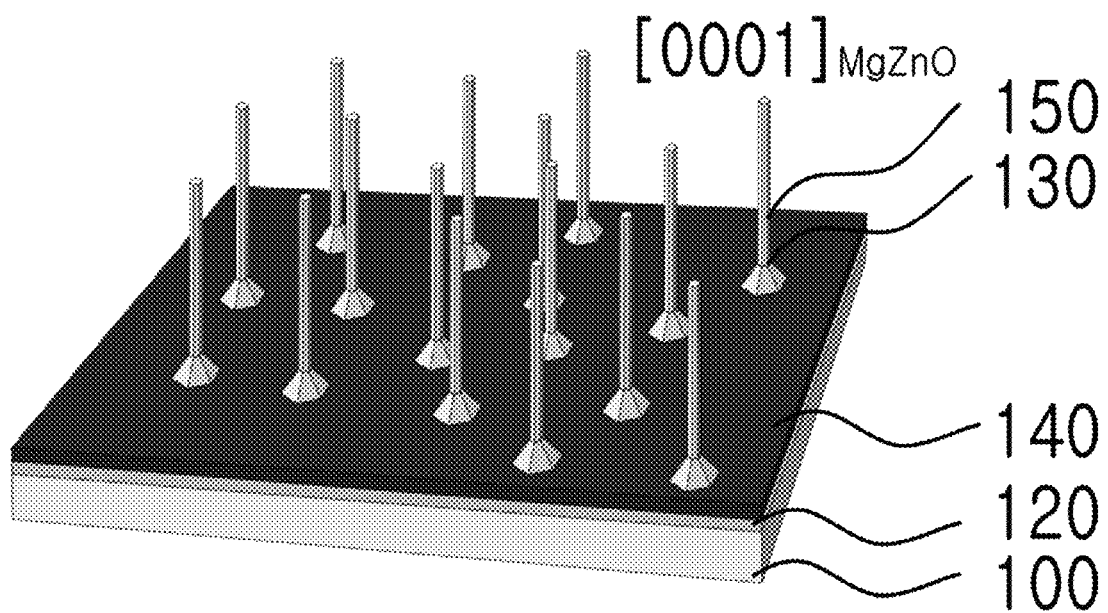
Figure 12:
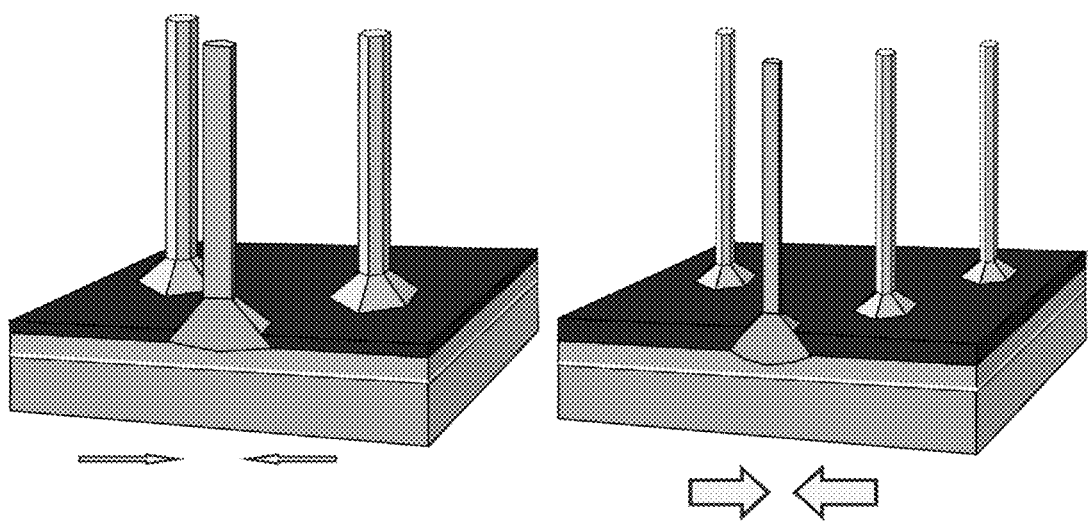
FIG. 12 a schematic perspective view showing the case that the formation of seed layers is influenced by the degree of the formation of amorphous layers containing a second metal as a main component.

In step 5 (S5), rods 150 are selectively formed on the seed layers (s-MgZnO) 130 and then grown (refer to FIG. 11).

As a result, the rods 150 are selectively grown on the seed layers (s-MgZnO) 130, and thus the rods 150 constitute metal oxide nanostructure together with the seed layers (s-MgZnO) 130. The rods 150 may be made of a ternary oxide alloy film having the same composition as the seed layers (s-MgZnO) 130 and may have the same crystal structure as the seed layers (s-MgZnO).

Concretely, the rods 150 may be made of a ternary oxide alloy film ($Zn_xMg_{1-x}O$ (0<x<1)) containing zinc as a main component. More preferably, the rods 150 may be made of a ternary oxide alloy film ($Zn_xMg_{1-x}O$ ($0.7 \leq x \leq 0.9$)).

In step 5 (S5), the rods 150 may be formed in a [0001] orientation which is perpendicular to the substrate 100. As described above, the growth of the seed layers (s-MgZnO) 130 is inhibited by the rapid growth of the amorphous layers (a-MgZnO) 140, and thus small-size seed layers (s-MgZnO) are formed. Therefore, the rods 150 can be grown on the small-size seed layers (s-MgZnO) only in the [0001] orientation (refer to FIGS. 12 to 16).

Further, the rods 150 may have a width of 5~15 nm. The growth of the rods 150 may be performed by any one selected from metalorganic chemical vapor deposition (MOCVD), a vapor epitaxy method and a molecular beam epitaxy method.

The seed layers and the rods of the present invention may have a wurtzite crystal structure.

Hereinafter, the present invention will be described in more detail with reference to the following Experimental Examples and Comparative Examples. However, the following Experimental Examples is set forth to illustrate the present invention, and the present invention is not limited thereto.

The electronic element of the present invention was manufactured as follows. First, a silicon substrate was ultrasonically washed in order of acetone, methanol and purified water for 5 minutes, and was then dried in an oven at a temperature of about 80° C. Subsequently, the silicon substrate was disposed in a chamber, and then the temperature in the chamber was maintained at 500° C. by an indirect heating method using induction coil, and the pressure in the chamber was maintained at 0.001 torr. Subsequently, dimethyl zinc [$ZnCH_3)_2$], which is a zinc-containing precursor, was supplied into the chamber at a flow rate of 5~10 μmol/min for 30 seconds, and then bis-cyclopentadienyl magnesium ($Cp_2Mg$), which is a magnesium-containing precursor, was supplied into the chamber at a flow rate of 1~5 μmol/min for 30 seconds. Subsequently, oxygen gas was supplied into the chamber at a flow rate of 50~100 sccm for 30 seconds. Thereafter, dimethyl zinc and 6N oxygen gas were further supplied into the chamber for 30 minutes with the pressure in the chamber increased to 1 torr and the temperature in the chamber maintained. At the same time, 6N argon gas was used as the carrier gas in the chamber.

In this Experimental Example, reactants were supplied into the chamber in the order of a zinc-containing precursor→a magnesium-containing precursor→oxygen gas. Here, the order of reactants means the order in which the reactants are supplied. The zinc-containing precursor which had been supplied earlier than the magnesium-containing precursor was continuously supplied into the chamber even when the supply of the magnesium-containing precursor had started. Also, the magnesium-containing precursor which had been supplied earlier than the zinc-containing precursor was continuously supplied into the chamber even when the supply of the zinc-containing precursor had started.

Figure 17:
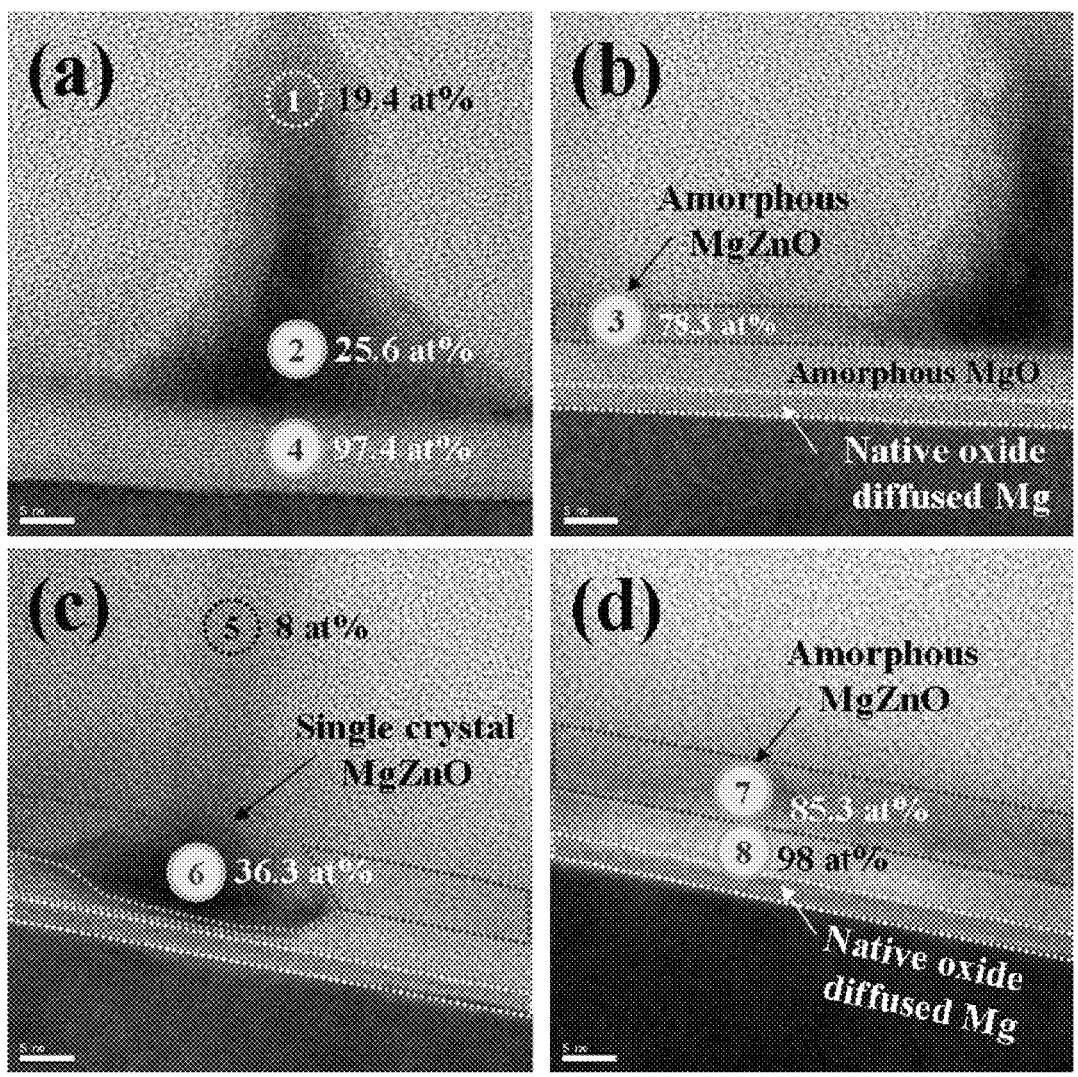
FIGS. 17 to 19 are views showing transmission electron microscopy (TEM) images and EDX point scan results for examining the accurate growth mechanism of MZO nanowires depending on the Mg flow rate.
Figure 18:
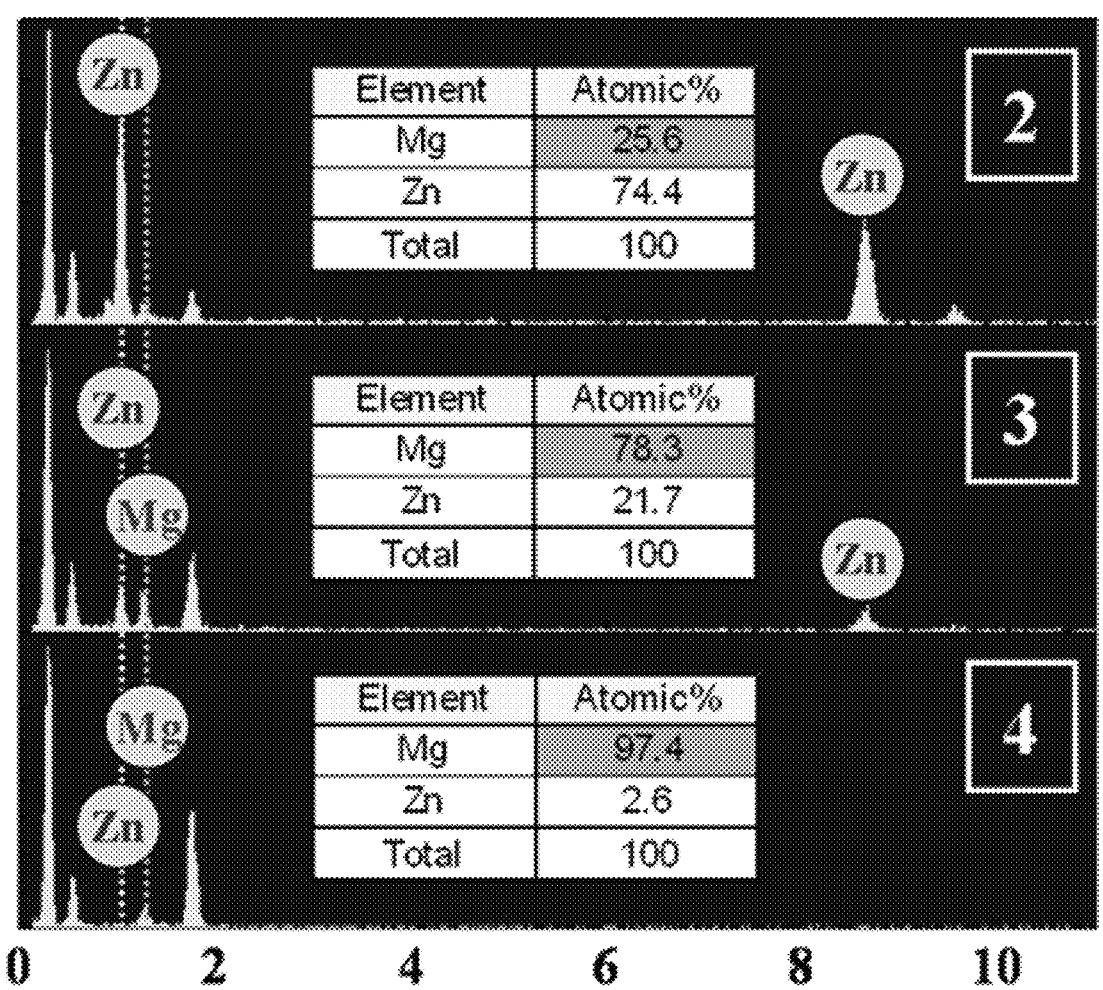
Figure 19:
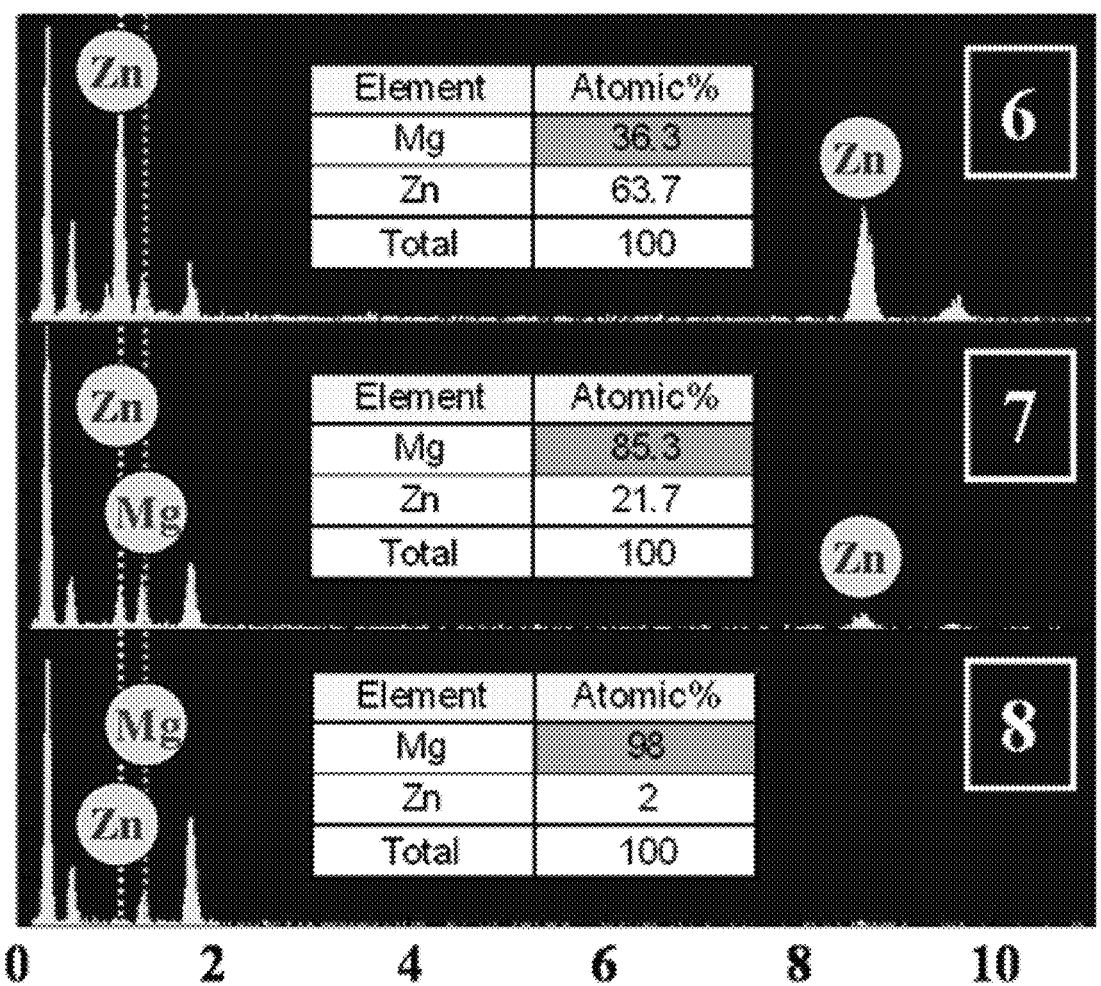

FIGS. 17 to 19 are views showing transmission electron microscope (TEM) images and EDX point scan results for examining the accurate growth mechanism of MZO nanowires depending on the Mg flow rate.

FIGS. 17(a) and 17(b) show SEM results of nanowires that were grown at an Mg flow rate of 80 SCCM (1.13E-6 mol/min), and FIGS. 17(c) and 17(d) show SEM results of nanowires that were grown at an Mg flow rate of 100 SCCM (1.41E-6 mol/min).

From FIGS. 17(a) and 17(c), it can be seen that there is about 2 times of the difference in diameter between nanowires, depending on Mg flow rate. Further, it can be seen from FIG. 17(a) that MgZnO nanostructure were epitaxially grown in a direction perpendicular to the silicon substrate, and that MgZnO nanostructure include seeds containing 25.6 at. % of Mg and nanowires containing 19.4 at. % of Mg.

In particular, it is noticed that three layers which are different from each other in contrast exist under and around nanowires although they are not shown in microwires. Among the three layers, the first layer has the same thickness as a native oxide layer of the microwires, but is seen gray not white. Therefore, it is determined that the first layer is a Mg-diffused native oxide layer.

The second layer exists in the form of a gray belt. It was found by TEM analysis that the second layer is an amorphous layer and includes 97.4 at. % of Mg. That is, it was found that the second layer is an MgO layer containing no Zn. As shown in FIG. 17(b), it can be seen that the third layer exists as an amorphous layer exhibiting rich contrast around seeds. That is, it was found that the third layer is an amorphous MgZnO layer containing 73.3 at. % of Mg, which includes a small amount of Zn.

On the other hand, it can be seen that the MgZnO nanostructure having been grown at a relatively high Mg flow rate include nanowires containing a relatively small amount of Mg (8 at. %), seed layers containing a relatively large amount of Mg (36.3 at. %) and amorphous MgZnO layers containing a relatively large amount of Mg (85.3 at. %). Further, it was found that, in the MgZnO nanostructure that were grown at an Mg flow rate of 100 SCCM, the thickness of the seed layer is decreased from 40 nm to 8 nm, and the thickness of the amorphous MgZnO layer is increased from 3 nm to 8 nm. The changes in shape of nanostructure depending on the increase of an Mg flow rate are modeled in FIGS. 7 to 11.

Figure 20:
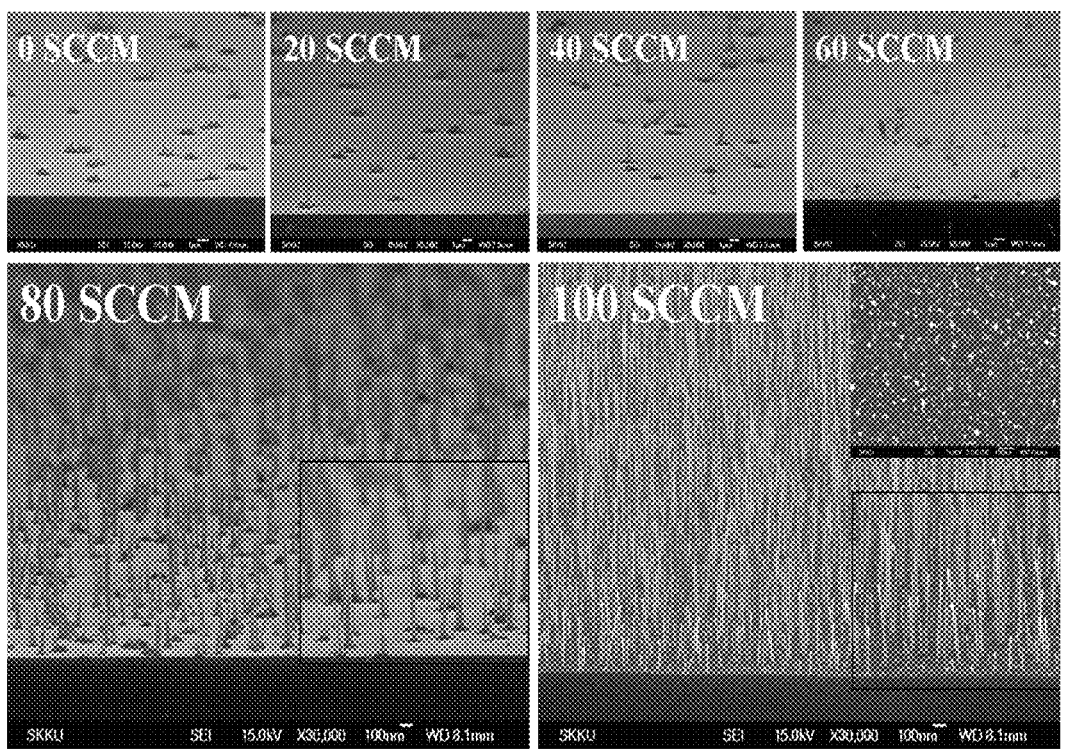
FIG. 20 shows transmission electron microscope (TEM) photographs related to the formation of nanowires depending on the inflow of magnesium.
Figure 21:
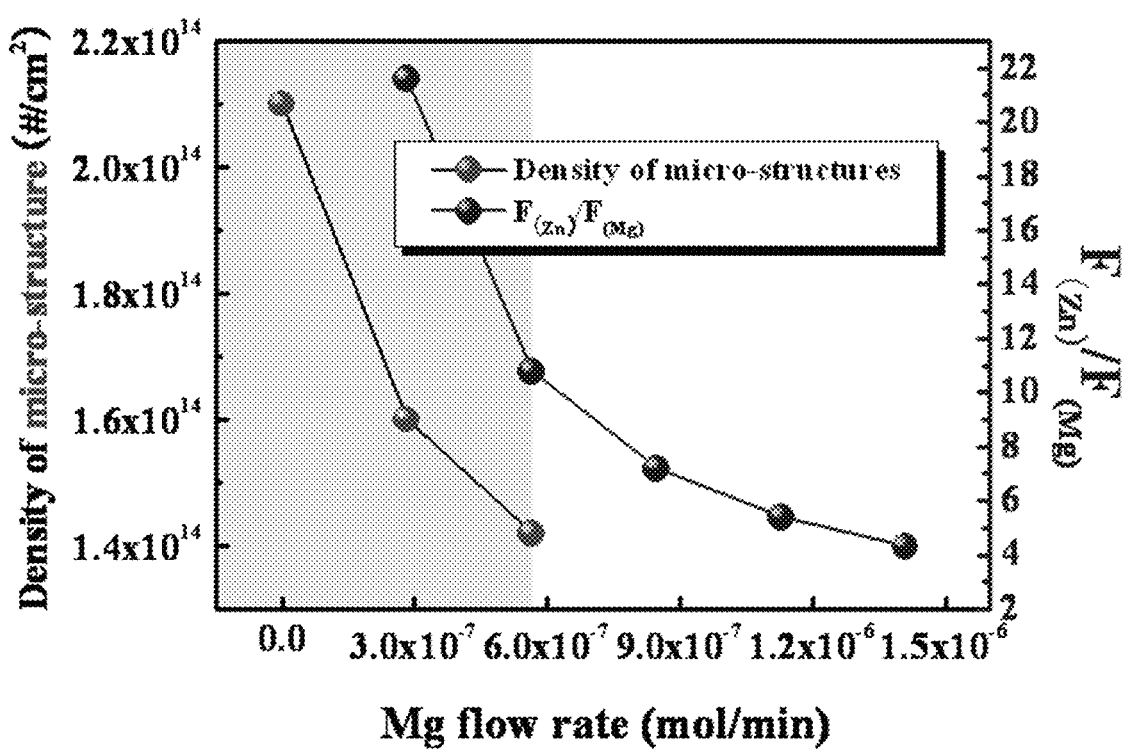
FIGS. 21 to 24 are graphs showing the density of microwires and nanowires and PL intensity at room temperature of nanowires depending on the Mg flow rate.
Figure 22:
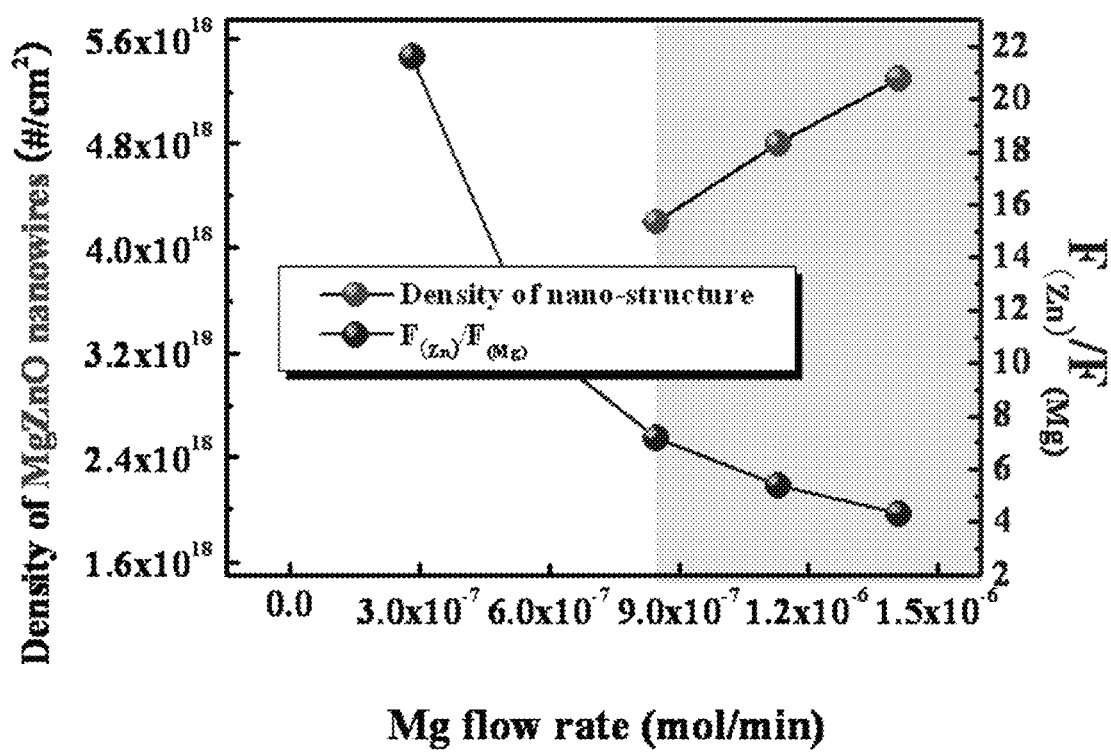
Figure 23:
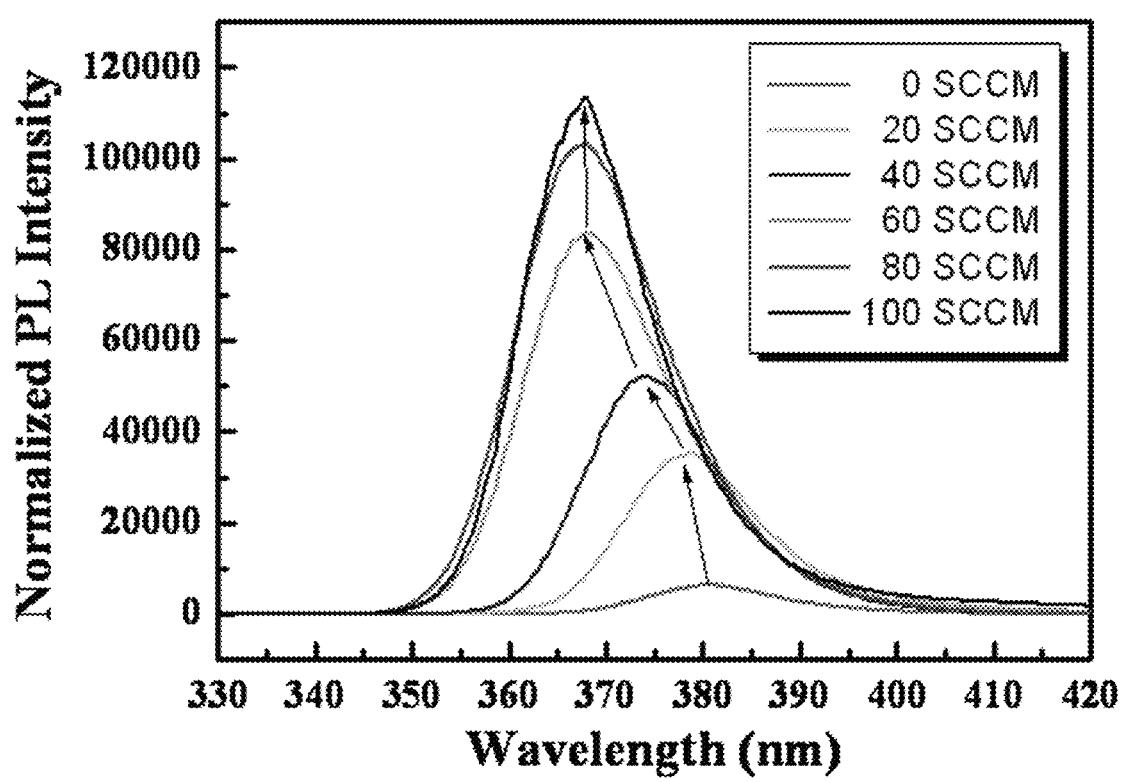
Figure 24:
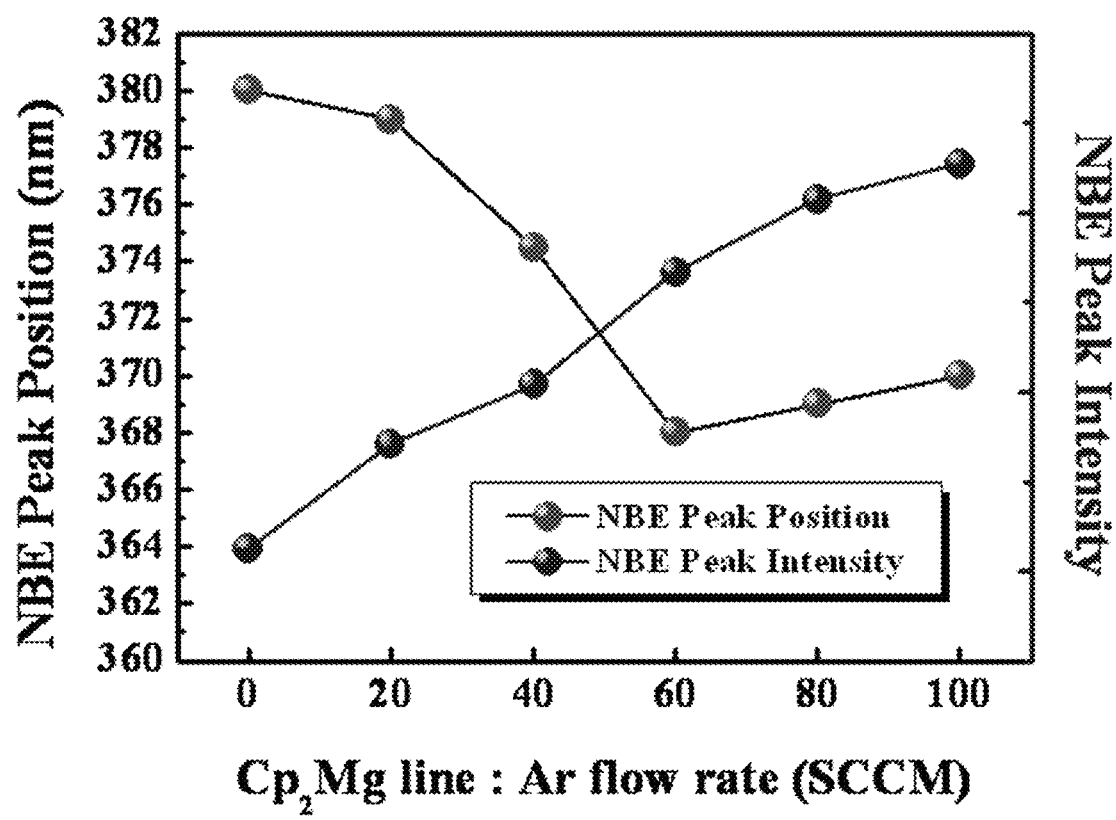

FIG. 20 shows transmission electron microscope (TEM) photographs related to the formation of nanowires depending on the inflow of magnesium (Mg).

FIGS. 21 to 24 are graphs showing the density of microwires and nanowires and PL intensity at room temperature of nanowires depending on Mg flow rate. In the case of microwires, the density thereof was decreased from $2.1 \times 10^{14}$ to $1.4 \times 10^{14}/cm^2$ as the Mg flow rate increases, and, in the case of nanowires, the density thereof was increased from $4.2 \times 10^{18}$ to $5.3 \times 10^{18}/cm^2$ as the Mg flow rate increases. It can be considered that the density of microwires or nanowires is the density of microseeds or nanoseeds. Therefore, it can be seen that magnesium (Mg) plays an important role in the structural change from low-density microseeds to high-density nanoseeds.

Further, in the results of the PL density of nanowires, the increase in PL density of nanowires and the blue shift behavior in PL peak position can be observed, depending on the Mg flow rate. In this case, the increase in PL density of nanowires is closely related to the diameter of nanowires, the degree of vertical growth and the change in the amount of Mg.

In particular, the fact that PL peak position is saturated at a Mg flow rate of 80 SCCM (Mg=8.47E-7 mol/min) while being shifted means that the amounts of Mg in the tips of nanowires are nearly equal to each other.

Figure 25:
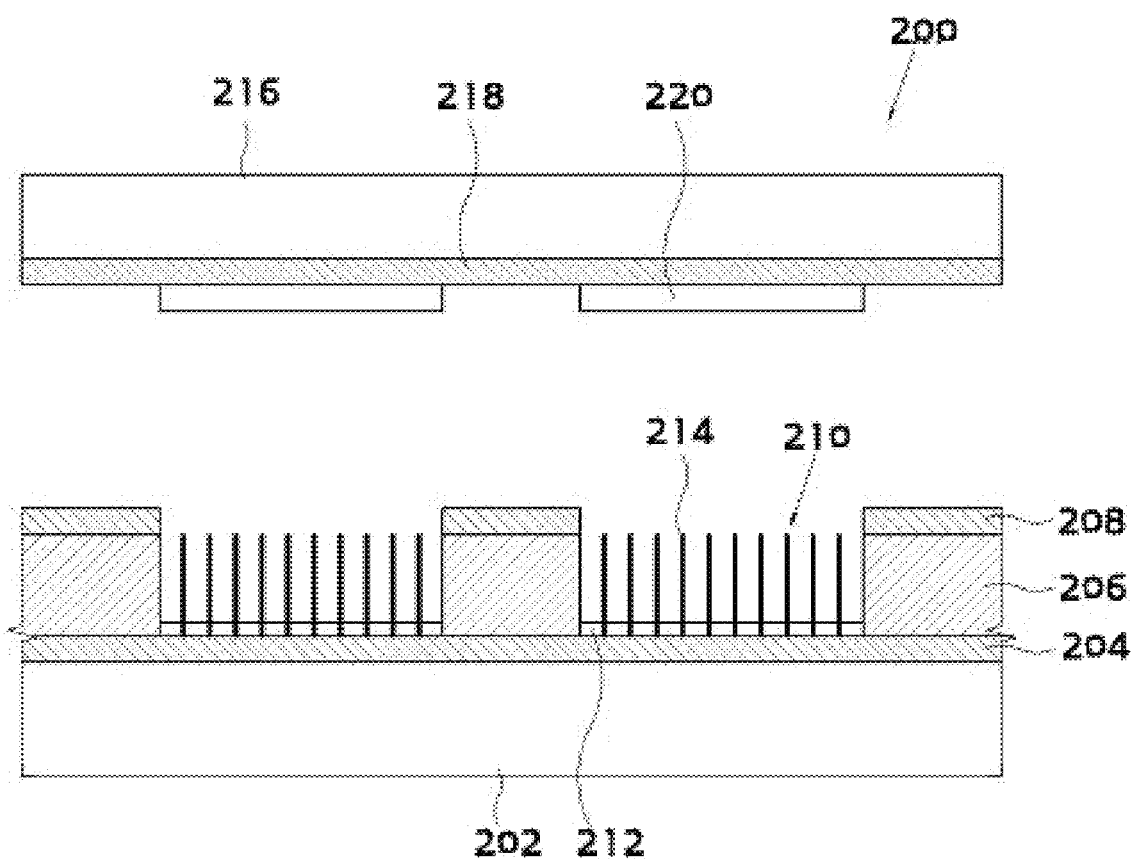
FIG. 25 is a sectional view showing an electronic element according to an embodiment of the present invention.

Hereinafter, an electronic element including the metal oxide nanostructure according to an embodiment of the present invention will be described with reference to FIG. 25.

The electronic element of the present invention, to which nanostructure are applied, may be applied to a field emission display (FED), a plasma display panel (PDP), a microwave amplifier, a beam laser used in the manufacturing semiconductors, or a biosensor.

Among them, the field emission display (FED), plasma display panel (PDP) or microwave amplifier includes a cathode and an anode spaced apart from the cathode, and has a structure in which the cathode is provided with the electronic element.

The electronic element of the present invention is applied to a field emission display (FED). Meanwhile, the field emission display (FED) may be configured such that it has a diode structure (cathode-anode structure) or a triode structure (cathode-gate-anode structure). The gate electrode is preferably used because it is more suitable for controlling field emission. In conclusion, the electronic element applied to a field emission display having a triode structure will be described.

The electronic element of the present invention includes a first substrate 202, and a cathode 204 formed on the first substrate 202. The first substrate 202 may be made of any one selected from the group consisting of silicon, sapphire, gallium nitride, glass, and indium tin oxide (ITO).

The electronic element further includes a second substrate 216 spaced apart from and facing the first substrate 202, and an anode 218 formed on the second substrate 216.

The cathode 204 is provided thereon with the metal oxide nanostructure formed by the method of the present invention.

Further, a plurality of spacers (not shown) may be disposed between the first substrate 202 and the second substrate 216 in order to support the first substrate 202 and the second substrate 216, and the space between the first substrate 202 and the second substrate 216 has a vacuum atmosphere. Moreover, the cathode 204 may be disposed on the first substrate 202 in the pattern of a plurality of stripes along a first direction.

The first substrate 202 is provided thereon with insulation layers 206 having openings formed therebetween. The insulation layers 206 may be respectively provided thereon with a plurality of gate electrodes 208 growing and crossing along a second direction different from the first direction.

Metal oxide nanostructure 214 are formed on the cathode 204 exposed by the openings 210. Moreover, amorphous layers 212 are formed between the metal oxide nanostructure 214 formed on the cathode 204. That is, electronic elements are disposed on the cathode 204 exposed by the openings 210.

The anode 218 may be disposed such that it faces the cathode 204. Further, the anode 218 may further include fluorescent layers 220 thereon.

The fluorescent layers 220 are white fluorescent layers, but may be a combination of red, green and blue fluorescent layers.

In the electronic element of the present invention, the metal oxide nanostructure 214 are vertically aligned and have a small width (diameter), so that this electronic element can exhibit excellent field emission effects.

As described above, according to the manufacturing method of metal oxide nanostructure of the present invention, the area and thickness of an amorphous layer can be controlled by controlling the flow rate of the main component of the amorphous layer and the flow rate of the main component of the single crystalline seed layer, thus controlling the density and diameter of the seed layer.

Further, the electronic element including the metal oxide nanostructure according to the present invention have improved field emission characteristics.

Advantages of the invention are not limited to the above mentioned advantages, and will become apparent from the following description of embodiments with reference to the accompanying drawings.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Simple modifications, additions and substitutions of the present invention belong to the scope of the present invention, and the specific scope of the present invention will be clearly defined by the appended claims.

What is claimed is:

1. A manufacturing method of metal oxide nanostructure, comprising the steps of:
   (S1) supplying a precursor containing a first metal, a precursor containing a second metal and oxygen onto a substrate;
   (S2) forming an amorphous second metal oxide layer on the substrate;
   (S3) forming first nuclei containing the first metal as a main component and second nuclei containing the second metal as a main component on the substrate;
   (S4) converting the first nuclei into single crystalline seed layers spaced apart from each other and converting the second nuclei into amorphous layers surrounding the first nuclei; and
   (S5) selectively forming rods on the seed layers and then growing the rods,
   wherein the first meal, the second metal and the oxygen are supplied throughout steps 1 to 5 (S1 to S5).

2. The method according to claim 1, wherein, in step 1 (S1), the precursor containing the first metal, the precursor containing the second metal, and the oxygen are simultaneously supplied.

3. The method according to claim 1, wherein, in step 1 (S1), the precursor containing the first metal is supplied earlier than the precursor containing the second metal.

4. The method according to claim 1, wherein, in step 5 (S5), the growth of the rods is performed by any one selected from metalorganic chemical vapor deposition (MOCVD), a vapor epitaxy method and a molecular beam epitaxy method.

5. The method according to claim 1, wherein the substrate is made of any one selected from the group consisting of silicon, sapphire, gallium nitride, glass, and indium tin oxide (ITO).

6. The method according to claim 1, wherein the seed layers and the rods have a wurtzite crystal structure.

7. The method according to claim 1, wherein the precursor containing the first metal and the precursor containing the second metal are supplied by carrier gas including an inert gas.

8. An electronic element, comprising:
   a first substrate including a cathode;
   a second substrate spaced apart from the first substrate and including an anode; and
   a metal oxide nanostructure formed on the cathode and formed by the method of claim 1.

9. The electronic element according to claim 8, wherein the first substrate is made of any one selected from the group consisting of silicon, sapphire, gallium nitride, glass, and indium tin oxide (ITO).

10. The electronic element according to claim 8, wherein the second substrate is made of indium tin oxide (ITO).

11. The electronic element according to claim 8, wherein the anode faces the cathode, and includes fluorescent layers thereon.

12. The electronic element according to claim 8, wherein the electrode element is applied to any one selected from the group consisting of a field emission display (FED), a plasma display panel (PDP), a microwave amplifier, a beam laser used in the manufacturing semiconductors, and a biosensor.

13. The electronic element according to claim 8, wherein the cathode is disposed on the first substrate in a pattern of a plurality of stripes along a first direction.

14. The electronic element according to claim 13, wherein the cathode further includes a plurality of gate electrodes growing and crossing along a second direction different from the first direction thereon.

15. The method according to claim 1, wherein the second metal forms an amorphous phase at a temperature at which the first metal forms a single-crystal phase.

16. The method according to claim 15, wherein the first metal is zinc (Zn), and the second metal is magnesium (Mg).

17. The method according to claim 16, wherein a flow ratio of zinc (Zn) and oxygen supplied onto the substrate is 1:180~1:200.

18. The method according to claim 16, wherein a flow ratio of zinc (Zn) and magnesium (Mg) supplied onto the substrate is 1:¼~1:⅛.

19. The method according to claim 16, wherein the precursor containing zinc (Zn) is any one selected from the group consisting of dimethyl zinc [$Zn(CH_3)_2$], diethyl zinc [$Zn(C_2H_5)_2$], zinc acetate [$Zn(OOCCH_3)_2 \cdot H_2O$], zinc acetate anhydride [$Zn(OOCCH_3)_2$], and zinc acetylacetonate [$Zn(C_5H_7O_2)_2$].

20. The method according to claim 16, wherein the precursor containing magnesium (Mg) is any one selected from the group consisting of bis-cyclopentadienyl magnesium ($Cp_2Mg$), iodomethyl magnesium (MeMgI), and dimethyl magnesium ($Et_2Mg$).

21. The method according to claim 16, wherein, in step 3 (S3), the forming of the first nuclei and the second nuclei is performed at a temperature of 400~600° C. and a pressure of less than 1 torr for 20~40 seconds.

22. The method according to claim 16, wherein, in step 5 (S5), the rods have a width of 5~15 nm.

23. The method according to claim 16, wherein, in step 4 (S4), the seed layers are made of a ternary oxide alloy film ($Zn_xMg_{1-x}O$ (0<x<1)) containing zinc as a main component.

24. The method according to claim 23, wherein, in step 4 (S4), the seed layers are made of a ternary oxide alloy film ($Zn_xMg_{1-x}O$) of $0.6 \leq x \leq 0.8$.

25. The method according to claim 16, wherein, in step 4 (S4), the amorphous layers are made of a ternary oxide alloy film ($Zn_xMg_{1-x}O$ (0<x<1)) containing magnesium as a main component.

26. The method according to claim 25, wherein, in step 4 (S4), the amorphous layers are made of a ternary oxide alloy film ($Zn_xMg_{1-x}O$) of $0.3 \leq x \leq 0.5$.

27. The method according to claim 16, wherein the oxygen is supplied by oxygen-containing gas, and the oxygen-containing gas is any one selected from the group consisting of oxygen, ozone, nitrogen dioxide, water vapor, and carbon dioxide.

28. The method according to claim 7 or 27, wherein the carrier gas and the oxygen-containing gas are supplied for 20~40 seconds.

29. The method according to claim 7 or 27, wherein the carrier gas and the oxygen-containing gas are supplied at a temperature of 400~600° C.

30. The method according to claim 7 or 27, wherein the carrier gas and the oxygen-containing gas are supplied at a pressure of less than 1 torr.

31. The method according to claim 27, wherein the oxygen-containing gas is supplied at a flow rate of 50~100 SCCM.

32. The method according to claim 16, wherein, in step 5 (S5), the rods are made of a ternary oxide alloy film ($Zn_xMg_{1-x}O$ (0<x<1)) containing zinc as a main component.

33. The method according to claim 32, wherein, in step 5 (S5), the rods are made of a ternary oxide alloy film ($Zn_xMg_{1-x}O$) of $0.7 \leq x \leq 0.9$.

34. The method according to claim 33, wherein, in step 5 (S5), the rods are formed in a [0001] orientation which is perpendicular to the substrate.

* * * * *